United States Patent
Maekawa

(10) Patent No.: US 8,003,420 B2
(45) Date of Patent: Aug. 23, 2011

(54) DISPLAY DEVICE PROVIDED WITH SEMICONDUCTOR ELEMENT AND MANUFACTURING METHOD THEREOF, AND ELECTRONIC DEVICE INSTALLED WITH DISPLAY DEVICE PROVIDED WITH SEMICONDUCTOR ELEMENT

(75) Inventor: Shinji Maekawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/834,048

(22) Filed: Jul. 12, 2010

(65) Prior Publication Data

US 2010/0279449 A1  Nov. 4, 2010

Related U.S. Application Data

(62) Division of application No. 11/195,768, filed on Aug. 3, 2005, now Pat. No. 7,759,735.

(30) Foreign Application Priority Data

Aug. 20, 2004  (JP) ................................ 2004-241119

(51) Int. Cl.
*H01L 21/336* (2006.01)
(52) U.S. Cl. ............................. 438/34; 438/99; 438/149
(58) Field of Classification Search .................... 438/34, 438/99, 149
See application file for complete search history.

(56) References Cited

U.S. PATENT DOCUMENTS

| | | |
|---|---|---|
| 5,132,248 A | 7/1992 | Drummond et al. |
| 5,737,041 A | 4/1998 | Holmberg et al. |
| 5,814,834 A | 9/1998 | Yamazaki et al. |
| 5,874,746 A | 2/1999 | Holmberg et al. |
| 5,883,682 A | 3/1999 | Kim et al. |
| 6,066,506 A | 5/2000 | Holmberg et al. |
| 6,239,468 B1 | 5/2001 | Chang et al. |
| 6,416,583 B1 | 7/2002 | Kitano et al. |
| 6,426,595 B1 | 7/2002 | Odake et al. |
| 6,555,420 B1 | 4/2003 | Yamazaki |
| 6,573,964 B1 | 6/2003 | Takizawa et al. |

(Continued)

FOREIGN PATENT DOCUMENTS

CN  1196803 A  10/1998

(Continued)

OTHER PUBLICATIONS

Office Action (Application No. 200510092081.3; CN8098) Dated Apr. 10, 2009.

(Continued)

*Primary Examiner* — Long Pham
(74) *Attorney, Agent, or Firm* — Nixon Peabody LLP; Jeffrey L. Costellia

(57) ABSTRACT

According to one feature of the invention, a region of an insulating film surface at least overlapped with a part of a gate electrode or wiring is coated with an organic agent; a fluid in which conductive fine particles are dispersed in an organic solvent is discharged by a droplet discharging method in the insulating film surface ranging from a region where the organic agent is coated and left to a region where the organic agent is not coated. The organic agent is coated to improve wettability of the fluid in the insulating film surface, and one of each ends of the source electrode and the drain electrode adjacent to each other by interposing the curve therebetween is formed by being curved in a concave and the other end is formed by being curved in a convex.

18 Claims, 13 Drawing Sheets

U.S. PATENT DOCUMENTS

| | | |
|---|---|---|
| 6,587,165 B2 | 7/2003 | Hashimoto et al. |
| 6,627,263 B2 | 9/2003 | Kitano et al. |
| 6,630,274 B1 | 10/2003 | Kiguchi et al. |
| 6,715,871 B2 | 4/2004 | Hashimoto et al. |
| 6,787,407 B2 | 9/2004 | Nakamura et al. |
| 6,821,827 B2 | 11/2004 | Nakamura et al. |
| 6,891,236 B1 | 5/2005 | Yamazaki |
| 6,903,372 B1 | 6/2005 | Yamaguchi et al. |
| 6,908,796 B2 | 6/2005 | Furusawa |
| 6,911,675 B2 | 6/2005 | Kato et al. |
| 6,952,036 B2 | 10/2005 | Suzuki et al. |
| 6,994,414 B2 | 2/2006 | Hashimoto et al. |
| 7,061,010 B2 | 6/2006 | Minakata |
| 7,317,207 B2 | 1/2008 | Yamaguchi et al. |
| 2001/0029103 A1 | 10/2001 | Katz et al. |
| 2001/0034088 A1 | 10/2001 | Nakamura et al. |
| 2001/0040647 A1 | 11/2001 | Song et al. |
| 2002/0053881 A1 | 5/2002 | Odake et al. |
| 2002/0089616 A1 | 7/2002 | Hashimoto et al. |
| 2002/0136829 A1 | 9/2002 | Kitano et al. |
| 2002/0195644 A1 | 12/2002 | Dodabalapur et al. |
| 2003/0030689 A1 | 2/2003 | Hashimoto et al. |
| 2003/0083203 A1 | 5/2003 | Hashimoto et al. |
| 2003/0085397 A1 | 5/2003 | Geens et al. |
| 2003/0143794 A1 | 7/2003 | Nakamura et al. |
| 2003/0219934 A1 | 11/2003 | Furusawa |
| 2004/0038138 A1 | 2/2004 | Kiguchi et al. |
| 2004/0113161 A1 | 6/2004 | Suzuki et al. |
| 2004/0125250 A1 | 7/2004 | Park |
| 2005/0054181 A1 | 3/2005 | Nakamura et al. |
| 2005/0250262 A1 | 11/2005 | Suzuki et al. |
| 2007/0024769 A1 | 2/2007 | Park |
| 2008/0111134 A1 | 5/2008 | Yamaguchi et al. |
| 2008/0129943 A1 | 6/2008 | Cho et al. |

FOREIGN PATENT DOCUMENTS

| | | |
|---|---|---|
| CN | 1351319 | 5/2002 |
| EP | 0 842 455 B1 | 10/2002 |
| EP | 1 416 069 A1 | 5/2004 |
| EP | 2 199 437 A2 | 6/2010 |
| JP | 62-247569 | 10/1987 |
| JP | 03-085530 | 4/1991 |
| JP | 03-159174 | 7/1991 |
| JP | 06-163584 | 6/1994 |
| JP | 07-333648 | 12/1995 |
| JP | 10-056193 | 2/1998 |
| JP | 10-170960 | 6/1998 |
| JP | 10-209463 | 8/1998 |
| JP | 11-251259 | 9/1999 |
| JP | 11-326951 | 11/1999 |
| JP | 2002-299833 | 10/2002 |
| JP | 2002-324966 | 11/2002 |
| JP | 2003-080694 | 3/2003 |
| JP | 2003-317945 | 11/2003 |
| JP | 2003-318193 | 11/2003 |
| JP | 2003-318401 | 11/2003 |
| JP | 2005-093633 | 4/2005 |
| KR | 2001-0067364 A | 7/2001 |
| WO | WO 97-05523 | 2/1997 |
| WO | WO-03/016599 A1 | 2/2003 |
| WO | WO 2005/048222 | 5/2005 |
| WO | WO 2005/055178 | 6/2005 |

OTHER PUBLICATIONS

Chinese Office Action (Application No. 200510092081.3; CN8098) Dated Jun. 27, 2008, with English translation.

DISPLAY DEVICE PROVIDED WITH SEMICONDUCTOR ELEMENT AND MANUFACTURING METHOD THEREOF, AND ELECTRONIC DEVICE INSTALLED WITH DISPLAY DEVICE PROVIDED WITH SEMICONDUCTOR ELEMENT

FIELD OF THE INVENTION

The present invention disclosed in this specification relates to a method for manufacturing a display device provided with a semiconductor element according to a direct drawing process, a display device obtained by the method, and an electronic device installed with the display device. In this specification, a semiconductor element includes a thin film transistor.

DESCRIPTION OF THE RELATED ART

In order to manufacture an amorphous-silicon thin film transistor and a polycrystalline-silicon thin film transistor that are used for a liquid crystal display device and an electroluminescence (EL) display device, a plurality of photomasks is used and a photolithography process is repeated more than once.

In a manufacturing site of a thin film transistor, it is strongly required to reduce the number of photomasks and to omit a photolithography process. Thus, a direct drawing process for foaming a wiring pattern and a film pattern by discharging a droplet using an ink-jet technique or the like is considered as an alternative to a photolithography process as is described in Reference 1 (U.S. Pat. No. 5,132,248) and Reference 2 (Japanese Patent Laid-Open No. 2003-80694). Since a pattern can be formed without requiring a photolithography process by using a method based on the direct drawing process, the number of photomasks can be reduced.

Meanwhile, it is known that the ON-state current and operating speed of a thin film transistor can be increased by making the channel width (usually denoted by W) with respect to the channel length (usually denoted by L), that is, W/L larger. In other words, the ON-state current and operating speed of a thin film transistor can be increased by making the channel width W larger or the channel length L shorter.

In the case of manufacturing a thin film transistor according to a photolithography process, for example, the channel width W can be made larger as well as the channel length L can be made shorter by using a photomask whose mask pattern is changed. However, in the case of manufacturing a thin film transistor according to a direct drawing process by discharging a droplet, it cannot be said yet that a method for making the channel length shorter or the channel width larger without a complicated process is established.

SUMMARY OF THE INVENTION

It is an object of the present invention disclosed in this specification to omit a photolithography process by using a direct drawing process and to obtain a semiconductor element having high ON-state current and high operating speed in a manufacturing process of a display device provided with a semiconductor element.

Two straight lines are drawn to form an electrode or wiring by discharging a fluid (liquid or paste) uniformly dispersed in a predetermined organic solvent, including metal fine particles without being aggregated, by using an ink-jet technique or the like. At that time, when the two straight lines are drawn not to connect with each other, this causes a phenomenon that each fluid that forms the two straight lines is repelled with each other. This phenomenon is found based on the experience of the inventors.

In addition, a predetermined region is coated with an agent that improves the wettability of the fluid and the fluid is discharged to both of regions where the agent is coated and where the agent is not coated. This case causes a phenomenon that the discharged fluid spreads more in the region where the agent is coated than in the region where the agent is not coated. This is because the wettability of the fluid gets higher in the region where the agent is coated than in the region where the agent is not coated.

Wettability is evaluated by a contact angle of a fluid with respect to a solid surface, and the smaller a contact angle is, the higher the wettability of a fluid is. In this specification, high wettability refers to the case where a contact angle of a fluid with respect to a solid surface is less than 90°. In other words, the contact angle of the fluid in the region coated with the agent is less than 90°. According to the invention disclosed in this specification, it is sufficient that the contact angle of the fluid is smaller in the region where the agent is coated than in the region where the agent is not coated.

A thin film transistor one of semiconductor elements whose channel width W is made larger and channel length L is made shorter can be manufactured by utilizing these phenomena.

According to one invention disclosed in this specification, a display device provided with a semiconductor element comprises a gate electrode or wiring formed over a substrate; an insulating film formed to cover the gate electrode or wiring; a source electrode and a drain electrode formed over the insulating film; and a semiconductor film formed to be in contact with the source electrode, a drain electrode, and the insulating film in a curve sandwiched between the source electrode and the drain electrode, wherein the curve is over the gate electrode or wiring by interposing the insulating film therebetween, and wherein one of each ends of the source electrode and the drain electrode adjacent to each other by interposing the curve therebetween is curved in a concave, and the other end is curved in a convex.

According to another invention disclosed in this specification, a display device provided with a semiconductor element comprises a gate electrode or wiring formed over a substrate; an insulating film formed to cover the gate electrode or wiring; an island-shape first semiconductor film formed over the gate insulating film; source/drain regions of a second semiconductor film containing n-type impurities or p-type impurities formed over the first semiconductor film; source electrode and the drain electrode formed in the range of over the source/drain regions to over the gate insulating film; and a curve sandwiched between the source electrode and the drain electrode and between the source/drain regions, wherein the curve is over the gate electrode or wiring by interposing the insulating film and the first semiconductor film therebetween, wherein one of each ends of the source electrode and the drain electrode adjacent to each other by interposing the curve therebetween is curved in a concave, and the other end is curved in a convex, and wherein each ends of the source/drain regions adjacent to each other by interposing the curve therebetween has the same shape as each ends of the source electrode and the drain electrode.

According to another invention disclosed in this specification, a method for manufacturing a display device provided with a semiconductor element comprises the steps of forming a gate electrode or wiring over a substrate; forming an insulating film to cover the gate electrode or wiring; coating a region of the insulating film surface at least overlapped with part of the gate electrode or wiring with an organic agent; discharging a fluid in which conductive fine particles whose grain size is 1 nm or more and 100 nm or less are dispersed in an organic solvent by a droplet discharging method in both of regions where the organic agent is coated and left and where the organic agent is not coated of the insulating film surface; forming a source electrode and a drain electrode by baking and hardening the fluid; and forming a semiconductor film to be in contact with the source electrode and the drain electrode along with the insulating film in a curve sandwiched between the source electrode and the drain electrode, wherein the organic agent is coated to improve the wettability of the fluid in the insulating film surface than in the region where the organic agent is not coated, and wherein one of each ends of the source electrode and the drain electrode adjacent to each other by interposing the curve therebetween is formed by being curved in a concave, and the other end is formed by being curved in a convex.

According to another invention disclosed in this specification, a method for manufacturing a display device provided with a semiconductor element comprises the steps of forming a gate electrode or wiring over a substrate; forming an insulating film to cover the gate electrode or wiring; forming a first semiconductor film over the gate insulating film; forming a second semiconductor film containing n-type impurities or p-type impurities over the first semiconductor film; patterning the first semiconductor film and the second semiconductor film each to be an island-shape; coating a region of the island-shape semiconductor film surface at least overlapped with part of the gate electrode or wiring with an organic agent; discharging a fluid in which conductive fine particles whose grain size is 1 nm or more and 100 nm or less are dispersed in an organic solvent by a droplet discharging method in both regions where the organic agent is coated and left and where the organic agent is not coated of the gate insulating film surface; forming source electrode and the drain electrode by baking and hardening the fluid; and forming source/drain regions by dry etching the second semiconductor film with the use of the source electrode and the drain electrode as masks, wherein the organic agent is coated to improve the wettability of the fluid in the second semiconductor film surface than in the region where the organic agent is not coated, wherein a curve sandwiched between the source electrode and the drain electrode and between the source/drain regions is formed according to the step of forming the source electrode and the drain electrode and the step of forming the source/drain regions, wherein one of each ends of the source electrode and the drain electrode adjacent to each other by interposing the curve therebetween is formed by being curved in a concave, and the other end is formed by being curved in a convex, and wherein each ends of the source/drain regions adjacent to each other by interposing the curve therebetween has the same shape as each ends of the source electrode and the drain electrode.

According to the invention disclosed in this specification, the channel width W and the channel length L of a semiconductor element can easily be made larger and shorter, respectively. A semiconductor element high in ON-state current and operating speed can be manufactured without a photolithography process or omitting a photolithography process according to the invention disclosed in this specification.

These and other objects, features and advantages of the present invention will become more apparent upon reading of the following detailed description along with the accompanied drawings.

DETAILED DESCRIPTION OF THE INVENTION

Embodiment Modes 1 to 4 hereinafter described will explain a manufacturing process of a thin film transistor which is a semiconductor element and a manufactured thin film transistor.

Embodiment Mode 1

Figure 1A:
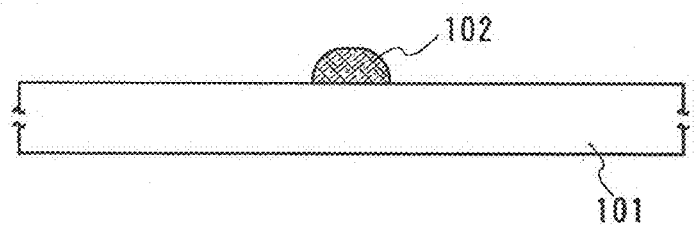
FIGS. 1A to 1E are cross-sectional views each showing a manufacturing process of a thin film transistor according to Embodiment Mode 1.

As shown in FIG. 1A, a gate electrode (wiring) 102 is formed over a substrate 101. Although FIG. 1A shows a cross-sectional shape of the gate electrode (wiring) 102 to be convex, the cross-section of the gate electrode (wiring) 102 is not limited to the convex shape. The substrate may be any one substrate of a glass substrate, a quartz substrate, or a plastic substrate. An example of using a method for forming a pattern having a predetermined shape by discharging the droplet of a fluid from a minute hole (hereinafter, referred to as a droplet discharging method in this specification) is hereinafter described as a method for forming the gate electrode (wiring) 102. A method using an ink-jet technique is a typical example of the droplet discharging method. The droplet discharging method described in this specification is not necessarily limited to the method using an ink-jet technique.

A fluid (liquid or paste) in which conductive fine particles whose grain size is 1 nm or more and 100 nm or less are contained and the fine particles are dispersed in a solvent is discharged over a substrate from, for example, an ink-jet head to form a predetermined shape. In this embodiment, the fluid is discharged in a straight line. Thereafter, the gate electrode is formed by baking and hardening the discharged fluid. After hardening the fluid, although the upper surface of the gate electrode to be formed sags downward and the cross-section sometimes becomes a concave, there is particular no problem.

In order to harden the fluid completely, baking temperatures over 150° C. are necessary. However, in the case where the conductive fine particles contained in the fluid contain silver as the main component, the fine particles lose the density and becomes porous, and thus, the surface is in a rough state when the baking temperatures are over 300° C. Therefore, the baking temperatures have to be below 300° C. Although one hour is enough for the baking time, the time is not necessarily limited to one hour as long as a fluid is hardened completely.

It is a necessary condition for the fluid that the conductive fine particles are uniformly dispersed in the solvent without being aggregated. For example, conductive metal paste described in Japanese Patent Laid-Open No. 2002-299833 or Japanese Patent Laid-Open No. 2002-324966 satisfies the condition. Although the fine particles containing silver as the main component is given as an example of the conductive fine particles contained in the fluid, the conductive fine particles are not limited to silver as long as the fluid can be used as an electrode or wiring after the baking. For example, fine particles containing as the main component any one of gold, copper, an alloy of gold and silver, an alloy of gold and copper, an alloy of silver and copper, or an alloy of gold, silver, and copper may also be used. Alternatively, fine particles containing conductive oxide such as indium tin oxide (ITO) as the main component may also be used.

A known sputtering method or vacuum vapor deposition method may also be used as a method for forming the gate electrode (wiring) 102. Alternatively, the gate electrode (wiring) 102 may be formed by a screen printing method instead of the droplet discharging method.

Figure 1B:
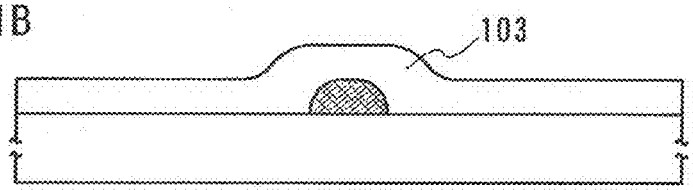

Then, as shown in FIG. 1B, a gate insulating film 103 is formed over the gate electrode (wiring) 102 and the substrate 101. For example, a polyimide film can be used as the gate insulating film 103. The polyimide film can be formed by a spin-coating method, which is formed by performing baking at temperatures below 200° C., specifically at 180° C. for one hour after performing spin coating. The polyimide film can also be formed by using a droplet discharging method instead of the spin-coating method. Further, another organic resin film or an inorganic insulating film such as silicon oxide or silicon nitride may also be used instead of the polyimide film.

Figure 1C:
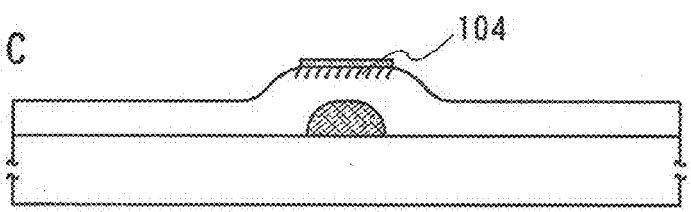
Figure 2A:
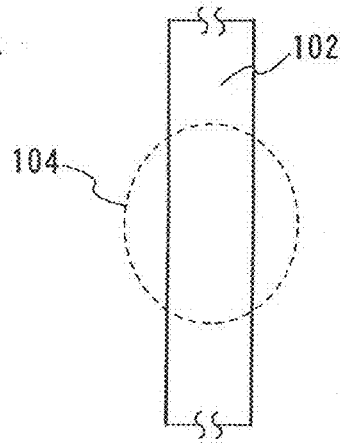
FIGS. 2A to 2C are top views each showing a manufacturing process of a thin film transistor according to Embodiment Mode 1.

As shown in FIG. 1C, a surface region 104 of the gate insulating film 103 is coated with an organic agent. The region 104 is a region at least overlapped with part of the gate electrode (wiring) 102 and a region of the surface of the gate insulting film 103 at least over the gate electrode (wiring) 102. FIG. 2A shows a top view in order to show relation of the gate electrode (wiring) 102 and the region 104. The droplet discharging method can be used as a method for coating an organic agent.

A high boiling point agent such as tetradecane, decanol, or octanol whose boiling point is over 150° C. that does not volatilize easily at a room temperature is preferably used for the organic agent that is coated. However, after coating the organic agent, it is desired that the organic agent does not remain behind as much as possible when the fluid is baked to form a source electrode and a drain electrode as will be described hereinafter. The organic agent for coating is desirable to be one whose boiling point is below 300° C. On the other hand, a low boiling point agent such as acetone or ethanol whose boiling point is below 100° C. that is dried soon after the coating is inappropriate for the present invention disclosed in this specification.

In addition, the same organic solvent as that contained in the fluid used to form a source electrode and a drain electrode is used as the organic agent for coating the region 104. Accordingly, the wettability of the fluid can certainly be improved.

For example, in the case of using a fluid in which conductive fine particles are dispersed in tetradecane, the region 104 is coated with tetradecane, and in the case of using a fluid in which conductive fine particles are dispersed in decanol, the region 104 is coated with decanol. However, it is sufficient that the organic agent for coating the region 104 is a high boiling point agent capable of improving the wettability of the fluid; therefore, the organic agent does not necessarily need to be the same as the organic solvent contained in the fluid.

After coating the organic agent as described above, a fluid (liquid or paste) in which conductive fine particles whose grain size is 1 nm or more and 100 nm or less are contained and the fine particles are dispersed in an organic solvent is discharged by using a droplet discharging method again with the organic agent left in the region 104 to draw a predetermined shape. It is sufficient that the same fluid as that used in forming the gate electrode (wiring) 102 is used for the fluid.

Figure 2B:
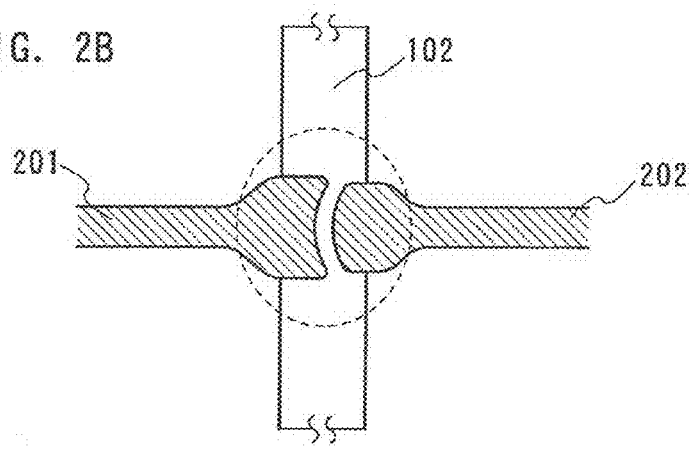

FIG. 2B shows a top view of after the drawing. Reference numeral 201 and 202 in FIG. 2B each denote fluids to be a source electrode and a drain electrode by being baked and hardened. The fluids 201 and 202 each show that the fluids are discharged in the region 104 where the organic agent is coated and left and a region where the organic agent is not coated. Since the fluids 201 and 202 have the higher wettability in the region 104 than the region where the organic agent is not coated, the fluids spreads in a direction along the surface of the gate insulating film 103.

The fluids 201 and 202 spread in the region 104 in the foregoing manner. Although this causes to make the fluids 201 and 202 closer with each other, the fluids never connect because both fluids are repelled with each other.

Figure 1D:
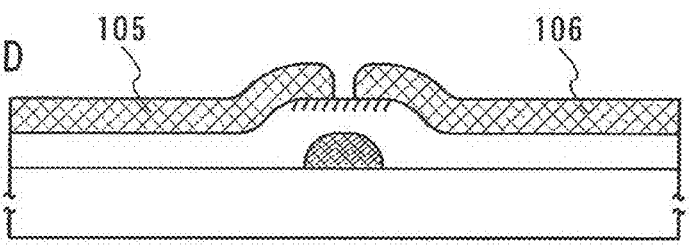

Thereafter, the fluids 201 and 202 are baked at temperatures over 150° C. for a predetermined time to be hardened. Accordingly, a source electrode and a drain electrode 105 and 106 shown in FIG. 1D are formed. After baking, it is desirable that the organic agent coated to the region 104 does not remain.

Figure 1E:
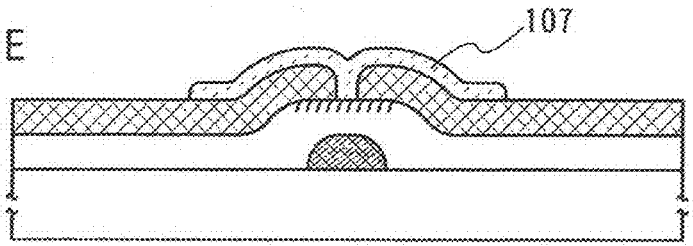

Then, as shown in FIG. 1E, a semiconductor film 107 is formed. For example, pentacene which is a p-type organic semiconductor having a shape in which five benzene rings are linearly joined is vapor-deposited with a metal mask as the semiconductor film 107. As shown in FIG. 1E, the semiconductor film 107 is formed to be in contact with the source electrode and the drain electrode 105 and 106 along with the gate insulating film 103 between the source electrode and the drain electrode 105 and 106.

Instead of the vapor-deposition, the pentacene may be formed by using a droplet discharging method or a screen printing method. Further, another organic semiconductor may be used instead of the pentacene. The semiconductor film 107 may be formed of a silicon film by a known CVD method instead of the organic semiconductor like pentacene. The crystallinity of the silicon film in this case is not particularly limited.

Figure 2C:
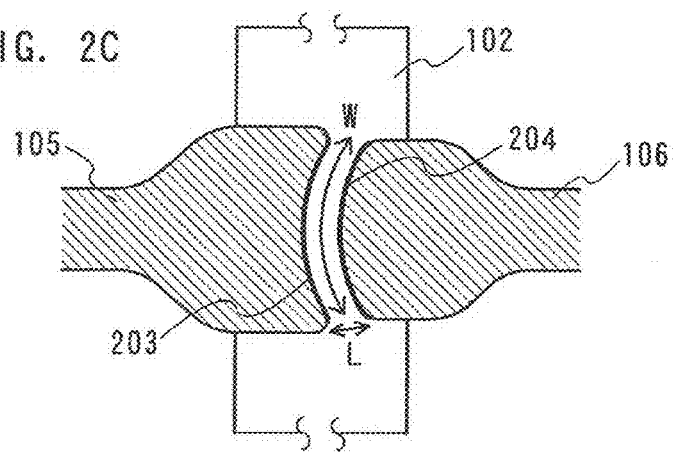

FIG. 2C is a top view showing a shape of the source electrode and the drain electrode 105 and 106. A channel length L and a channel width W are shown by an arrow in FIG. 2C. There is a curve (curved space) sandwiched between the source electrode and the drain electrode 105 and 106 over the gate electrode (wiring) 102. The channel length L corresponds to the width of the curved space (average of the width when the width is not uniform), and the channel width W corresponds to the length of the curved space along the curve.

One of each ends 203 and 204 of the source electrode and the drain electrode 105 and 106 adjacent to each other by interposing the curve (curved space) therebetween is curved in a concave, and the other end is curved in a convex. Then, in order to follow the concave curve of the one end, the other end is curved in a convex.

Figure 3A:
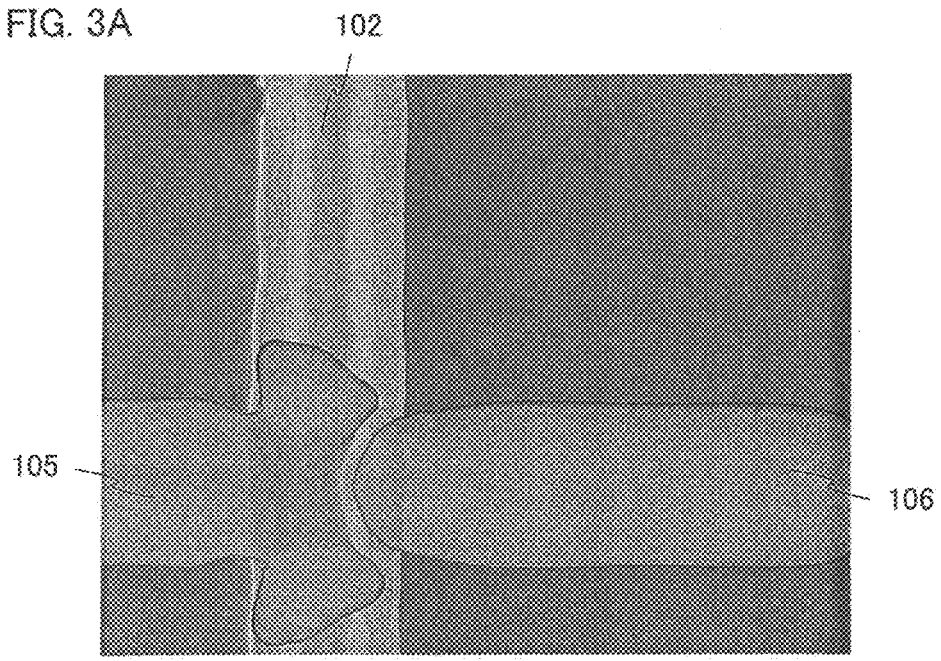
FIGS. 3A and 3B are photographs of top views each showing a thin film transistor according to Embodiment Mode 1 and a comparative example.
Figure 3B:
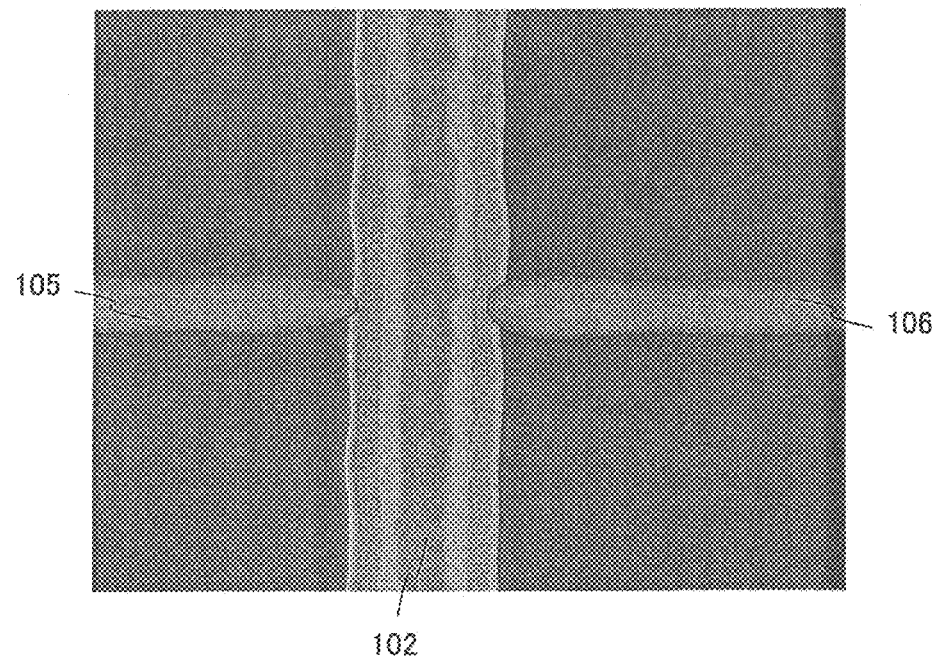

FIGS. 3A and 3B each show a photograph of a top view showing a thin film transistor. The thin film transistor is formed by using a glass substrate as the substrate, the source electrode and the drain electrode 105 and 106 and the gate electrode 102 that are formed by a droplet discharging method with the use of the fluid in which fine particles containing silver as the main component is contained and the fine particles are dispersed in tetradecane, a polyimide film in 120 nm thick as the gate insulating film, and the pentacene film in 50 nm thick as the semiconductor film. According to these photographs, the gate electrode 102 and the source electrode and the drain electrode 105 and 106 formed thereover can be distinguished.

FIG. 3A shows a thin film transistor formed according to this embodiment mode, in which a process of discharging tetradecane by using a droplet discharging method in a region of the polyimide film surface at least overlapped with the gate electrode 102 is performed before forming the source electrode and the drain electrode 105 and 106. FIG. 3B is a comparative example, which is different from FIG. 3A in that a thin film transistor is formed by omitting the process of discharging tetradecane to the polyimide film surface.

The thin film transistor shown in FIG. 3A has the channel width W of 350 and the channel length L of 50 μm (W/L=350/50), and the thin film transistor shown in FIG. 3B has the channel width W of 100 μm and the channel length L of 300 μm (W/L=100/300). In the thin film transistor shown in FIG. 3A, apparently, the channel length L is shorter and the channel width W is larger; therefore, the ON-state current and the operating speed of the thin film transistor are higher than those of the thin film transistor shown in FIG. 3B.

Figure 4:
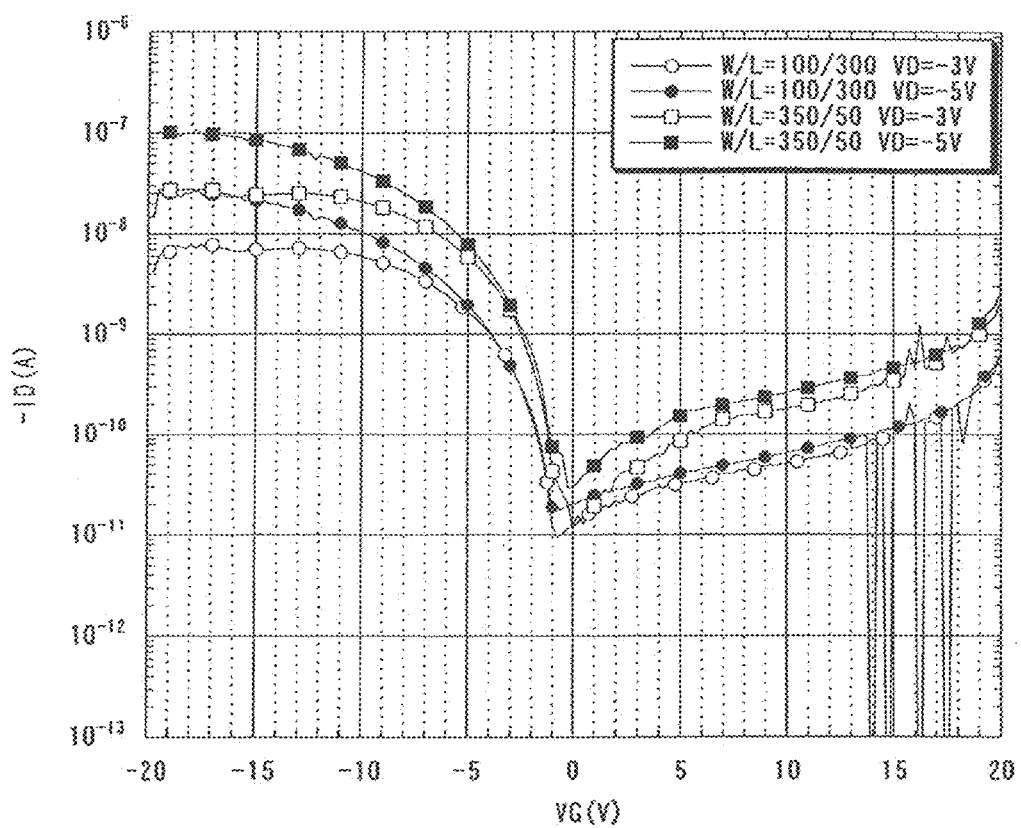
FIG. 4 is a view showing a $V_G$–$I_D$ characteristic of a thin film transistor according to Embodiment Mode 1 and a comparative example.

FIG. 4 shows measured results of a $V_G$–$I_D$ characteristic of the thin film transistors each shown in FIGS. 3A and 3B whose gate voltage $V_G$ is represented in a horizontal axis and drain current $I_D$ is represented in a vertical axis, when the drain voltage $V_D$ of the thin film transistors are −3V and −5V, respectively. Since a p-channel thin film transistor in which pentacene is used for a semiconductor film is measured, the drain current $I_D$ actually takes a minus value; thus, the vertical axis in FIG. 4 is represented by −$I_D$.

Paying attention to the range of $V_G \leq -3V$, the −$I_D$ value of the thin film transistor whose W/L value is 350/50 is larger than that of the thin film transistor whose W/L value is 100/300. This result indicates that the former thin film transistor has higher ON-state current than the latter thin film transistor.

Not limiting to this embodiment mode, the invention disclosed in this specification is suitable for the case of forming a thin film transistor with low mobility using an amorphous semiconductor, a microcrystal semiconductor, or an organic semiconductor for a channel-forming region. This is because thin film transistors using these semiconductor materials usually has low mobility of 5 $cm^2$/Vsec or less; therefore, the thin film transistors have to be designed to have large W/L, value to increase the ON-state current. Not only in the case of a thin film transistor using the above semiconductors but also in the case of a thin film transistor using polycrystalline silicon for a channel-forming region, the invention disclosed in this specification contributes in increasing the ON-state current and operating speed of the thin film transistors.

In addition, not limiting to this embodiment mode, the invention disclosed in this specification is suitable for the case of applying the invention to a display device such as a liquid crystal display device. For example, a gate insulating film is coated with an organic agent for improving the wettability of a fluid so as not to step over a region overlapped with a gate electrode (wiring). Accordingly, the fluid does not spread in the region where the organic agent is not overlapped with the gate electrode. Therefore, a source electrode and a drain electrode formed by hardening the fluid never glows in width in the region where the organic agent is not coated and not overlapped with the gate electrode. Accordingly, the channel width W of the thin film transistor can be made larger without decreasing the aperture ratio. This is because the aperture ratio is not affected even the source electrode and the drain electrode get wider only in a region overlapped with a region where the gate electrode is formed because light is not transmitted and can be shielded in the region where the gate electrode is formed.

In addition, according to this embodiment mode, a thin film transistor can be manufactured without a photolithography process and a photomask used in the process.

Embodiment Mode 2

In this embodiment mode, which is different from Embodiment Mode 1, a semiconductor film such as silicon will be used instead of an organic semiconductor like pentacene as a semiconductor film.

Figure 5A:
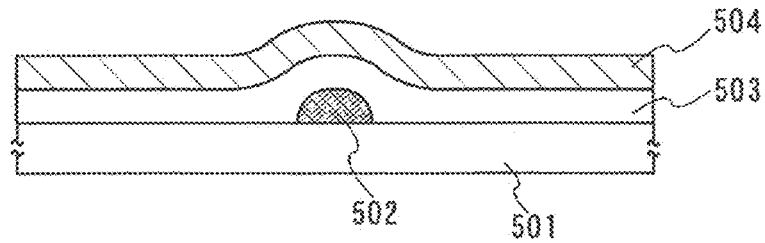
FIGS. 5A to 5E are cross-sectional views each showing a manufacturing process of a thin film transistor according to Embodiment Mode 2.

As shown in FIG. 5A, a gate electrode (wiring) 502 is formed over any one substrate 501 of a glass substrate, a quartz substrate, or a plastic substrate. As shown in Embodiment Mode 1, a droplet discharging method is preferably used for a method for forming the gate electrode (wiring) 502. Of course, the gate electrode (wiring) 502 may be formed by using another methods.

Then, a film composed of a skeleton structure formed by the bond of silicon and oxygen (hereinafter, referred to as a heat-resistant planarizing film in this specification) is formed as a first layer 503 of a gate insulating film. The heat-resistant planarizing film has higher heat resistance than an organic resin film and is obtained by coating and baking siloxane-based polymer by a spin-coating method or the like so that the gate electrode (wiring) 502 and the substrate 501 are covered therewith. The siloxane-based polymer may be coated by using a droplet discharging method instead of the spin-coating method. The first layer 503 is formed in 100 nm thick, for example. In addition, a silicon nitride film, a silicon oxide film, or a silicon oxynitride film may also be formed by a CVD method as the first layer 503.

Further, a silicon nitride film is formed over the first layer 503 by a CVD method as a second layer 504 of the gate insulating film. The second layer 504 is formed in 200 nm thick, for example. A method for forming the second layer 504 is not limited to the CVD method and the second layer 504 may be formed by another methods. In addition, the second layer 504 is not limited to the silicon nitride film and, for example, the second layer 504 may also be a silicon oxide film or a silicon oxynitride film. However, the second layer 504 and the first layer 503 are formed from different materials. Note that the gate insulating film may be formed of only one layer instead of the two layers in the foregoing manner.

Figure 5B:
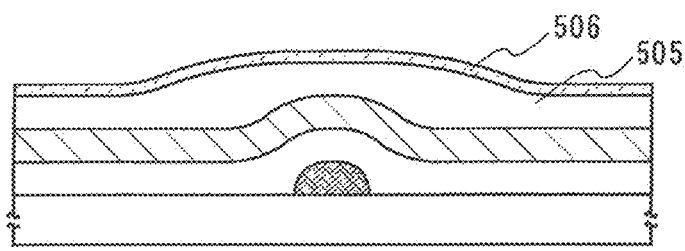

As shown in FIG. 5B, a first semiconductor film 505 is formed. An amorphous semiconductor film is formed over the second layer 504 of the gate insulating film by a CVD method with the use of a source gas such as silane (SiH$_4$) to obtain the first semiconductor film 505. The first semiconductor film 505 may be a crystalline semiconductor film by crystallizing the amorphous semiconductor film that is formed.

A specific example of a method for crystallizing the amorphous semiconductor film is shown. First, an amorphous silicon film is formed by a CVD method as the amorphous semiconductor film. Thereafter, the amorphous silicon film is coated with a solution containing a metal element that promotes crystallization of the silicon film, for example, nickel, and then heated in a furnace, for example, at 550° C. for four hours to perform solid phase growth.

Since the crystalline silicon film that is formed contains the metal element, treatment to be referred to as gettering is performed to remove the metal element. In other words, after removing an oxide film in the surface of the crystalline silicon film that is formed, at least one layer, for example, two layers of an amorphous silicon film containing phosphorus are formed and reheated in a furnace; therefore, the metal element is diffused from the crystalline silicon film to the amorphous silicon film containing phosphorus. It is sufficient that the heating condition is the same as that for the solid phase growth. Accordingly, the crystalline silicon film whose concentration of the metal element is reduced is obtained.

Besides the method in which the solid phase growth and the gettering process are combined, the amorphous semiconductor film may be crystallized by using a method for irradiating an amorphous semiconductor film with a laser beam, a method for performing rapid thermal annealing (referred to as RTA) to an amorphous semiconductor film, or a method in which any of the three methods are arbitrarily combined.

The first semiconductor film 505 may also be a so-called microcrystal semiconductor film. The microcrystal semiconductor film has an intermediated structure between an amorphous structure and a crystal structure (including a single crystalline structure and a polycrystalline structure) and includes a crystalline region having a short-range order along with lattice distortion. A crystalline region of from 0.5 nm to 20 nm can be observed at least in part of the region in the film. In the case of the microcrystal semiconductor film, Raman spectrum is shifted to a lower wave number side less than 520 cm$^{-1}$. Diffraction peak of (111) or (220) to be caused from a crystal lattice of silicon is observed in X-ray diffraction. The microcrystal semiconductor film is formed by performing glow discharge decomposition (plasma CVD) with a silicide gas, for example, SiH$_4$, Si$_2$H$_6$, Si$_2$H$_2$Cl$_2$, SiHCl$_3$, SiCl$_4$, or SiF$_4$ under deposition temperatures below 300° C. F$_2$ or GeF$_4$ may be mixed into the silicide gas.

A second semiconductor film 506 containing n-type impurities (phosphorus or arsenic) is formed over the first semiconductor film 505. The second semiconductor film 506 may also contain p-type impurities (boron) instead of the n-type impurities or along with the n-type impurities. The crystallinity of the second semiconductor film 506 may be any of an amorphous state, a microcrystalline state, or a polycrystalline state. In addition, the silicon film containing phosphorus in which the metal element is diffused by performing the gettering treatment can be used as the second semiconductor film 506. Accordingly, there is no necessity to remove the silicon film containing phosphorus in which the metal element is diffused.

Figure 5C:
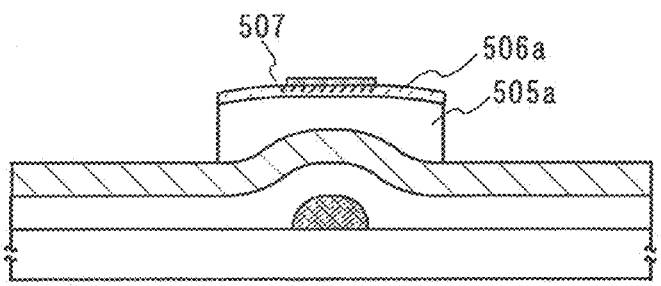

As shown in FIG. 5C, an island-shape first semiconductor film 505a and an island-shape second semiconductor film 506a is obtained by patterning the first semiconductor film 505 and the second semiconductor film 506. The patterning may be performed by a known photolithography method and further the patterning can also be performed without a photomask by using a laser direct drawing apparatus.

Then, a region 507 in the surface of the second semiconductor film 506 that is patterned in an island-shape is coated with an organic agent with a high boiling point agent whose boiling point is over 150° C. like tetradecane, decanol, or octanol. The region 507 coated with the organic agent is a region at least overlapped with part of the gate electrode (wiring) 502. The organic agent to be coated to the region 507 has to be able to improve the wettability of a fluid subsequently used to form a source electrode and a drain electrode.

Figure 5D:
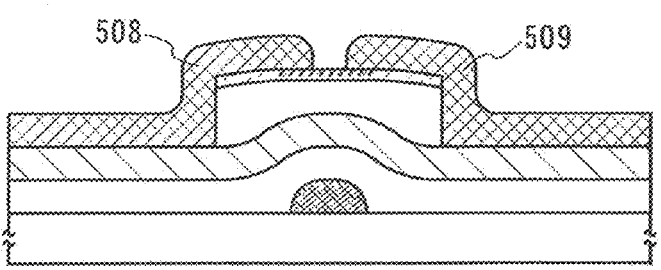

As shown in FIG. 5D, a source electrode and a drain electrode 508 and 509 are formed by using a droplet discharging method in the same manner as Embodiment Mode 1. It is sufficient that a fluid shown in Embodiment Mode 1 is used for the fluid to be discharged. For example, the source electrode and the drain electrode 508 and 509 containing silver as the main component are formed after discharging, from an ink-jet head or the like, a fluid in which fine particles containing silver as the main component whose grain size is 1 nm or more and 100 nm or less are contained and the fine particles are dispersed in tetradecane, and then baking the fluid under a predetermined condition to be hardened.

Under a condition to leave the fluid in the region 507, the fluid is discharged in the region 507 and the surface of the second layer 504 of the gate insulating film where the organic agent is not coated. The discharged fluid spreads along the surface of the second semiconductor film 506; therefore, the source electrode and the drain electrode 508 and 509 having the same shape as that in Embodiment Mode 1 is obtained. In other words, there is a curve (curved space) sandwiched between the source electrode and the drain electrode 508 and 509 over the gate electrode (wiring) 502. One of each ends of the source electrode and the drain electrode 508 and 509 adjacent to each other by interposing the curved space therebetween is curved in a concave, and the other end is curved in a convex. Then, in order to follow the concave curve of the one end, the other end is curved in a convex.

Figure 5E:
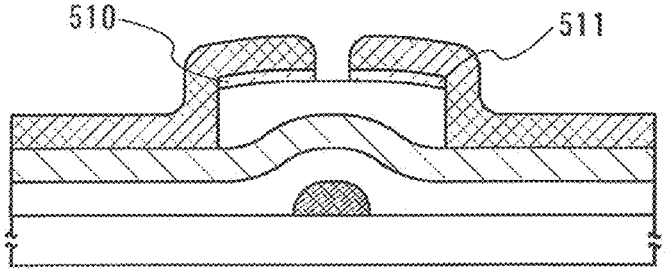

As shown in FIG. 5E, source/drain regions 510 and 511 are formed by etching the second semiconductor film 506 that is patterned in an island-shape, using the source electrode and the drain electrode 508 and 509 as masks. At the time of the etching, a dry etching method capable of anisotropic etching is used. In addition, the surface of the first semiconductor film 505 may be partially etched along with the second semiconductor film 506. Accordingly, a so-called channel-etch thin film transistor is formed. In such a case, the etching has to be performed under a condition not to expose the surface of the second layer 504 of the gate insulating film. The source/drain regions 510 and 511 that are formed have the same curved shape as the source electrode and the drain electrode 508 and 509.

In the same manner as Embodiment Mode 1, a thin film transistor that is obtained according to this embodiment mode including a process of coating the region 507 with the organic agent has the shorter channel length L and the larger channel width W.

Embodiment Mode 3

This embodiment mode will show an example in which a thin film transistor shown in Embodiment Mode 1 is formed in a double-gate structure.

Figure 6A:
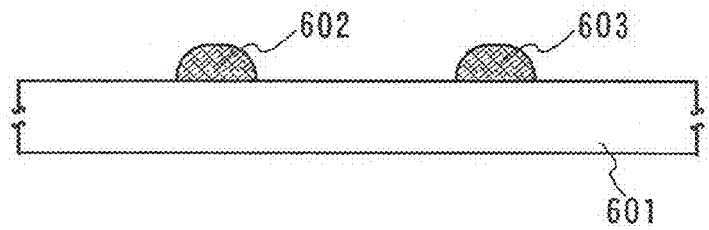
FIGS. 6A to 6E are cross-sectional views each showing a manufacturing process of a thin film transistor according to Embodiment Mode 3.

As shown in FIG. 6A, gate electrodes (wirings) 602 and 603 are formed over any one substrate 601 of a glass substrate, a quartz substrate, or a plastic substrate by using a droplet discharging method, for example.

Figure 6B:
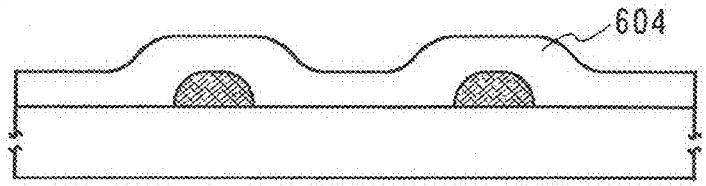

As shown in FIG. 6B, a polyimide film is formed as a gate insulating film 604 over the gate electrodes (wirings) 602 and 603 and the substrate 601 by a spin-coating method, for example. In the same manner as Embodiment Mode 1, the gate insulating film 604 is not limited to the polyimide film.

Figure 6C:
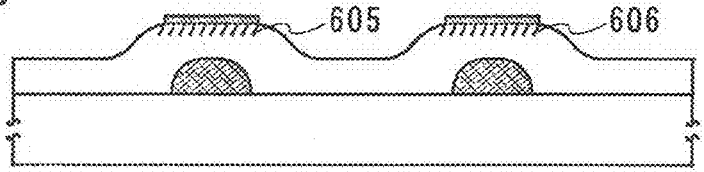

As shown in FIG. 6C, regions 605 and 606 in the surface of the gate insulating film 604 is coated with an organic agent by using a droplet discharging method, for example. The region 605 is a region at least overlapped with part of the gate electrode (wiring) 602, and the region 606 is a region at least overlapped with part of the gate electrode (wiring) 603. The organic agent to be coated to the regions 605 and 606 are a high boiling point agent shown in Embodiment Mode 1.

Figure 6D:
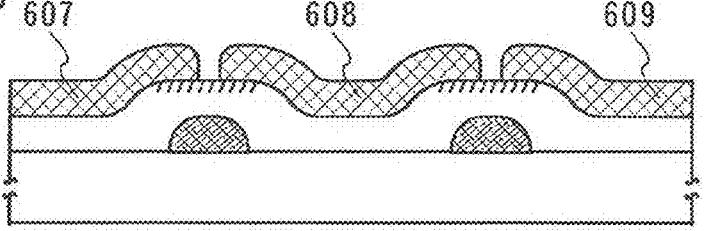

As shown in FIG. 6D, a source electrode and a drain electrode 607, 608, and 609 are formed over the gate insulating film 604 by a droplet discharging method. The regions where the source electrode and the drain electrode 607, 608, and 609 are formed in the regions 605 and 606 where the organic agent is coated and a region where the organic agent is not coated, over the gate insulating film 604.

Figure 6E:
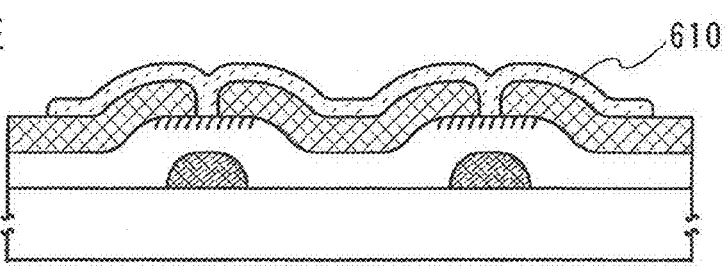

As shown in FIG. 6E, a semiconductor film 610 is formed by forming an organic semiconductor such as pentacene with the use of a vapor-deposition method, a droplet discharging method, or a screen printing method. The semiconductor film 610 is not limited to the organic semiconductor and a silicon film may be formed by using a CVD method. The crystallinity of the silicon film in this case is not particularly limited. The semiconductor film 610 is formed to be in contact with the source electrode and the drain electrode 607, 608, and 609 along with the gate insulating film 604 between the source electrode and the drain electrode 607 and 608 and the gate insulating film 604 between the source electrode and the drain electrode 608 and 609.

There is a curve (curved space) sandwiched between the source electrode and the drain electrode 607 and 608 over the gate electrode (wiring) 602. In addition, there is a curve (curved space) sandwiched between the source electrode and the drain electrode 608 and 609 over the gate electrode (wiring) 603. One of each ends of the source electrode and the drain electrode adjacent to each other by interposing the curved spaces therebetween is curved in a concave, and the other end is curved in a convex. Then, in order to follow the concave curve of the one end, the other end is curved in a convex.

The OFF-state current of a thin film transistor can be reduced much more than a single-gate structure shown in Embodiment Mode 1 by employing the double-gate structure shown in this embodiment mode.

Embodiment Mode 4

This embodiment mode will show an example in which a thin film transistor shown in Embodiment Mode 2 is formed in a double-gate structure.

Figure 7A:
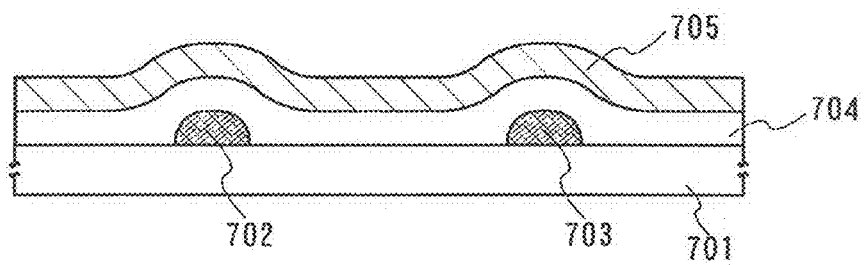
FIGS. 7A to 7E are cross-sectional views each showing a manufacturing process of a thin film transistor according to Embodiment Mode 4.

As shown in FIG. 7A, gate electrodes (wirings) 702 and 703 are formed over any one substrate 701 of a glass substrate, a quartz substrate, or a plastic substrate by using a droplet discharging method, for example.

Then, for example, a film composed of a skeleton structure formed by the bond of silicon and oxygen (a heat-resistant planarizing film) is coated and baked with siloxane-based polymer by a spin-coating method or the like as a first layer 704 of a gate insulating film. Further, for example a silicon nitride film is formed as a second layer 705 of the gate insulating film. In the same manner as Embodiment Mode 2, the first layer 704 and the second layer 705 may be formed by using another insulating film. However, the second layer 704 and the first layer 703 are formed from different materials. The gate insulating film may be formed of only one layer instead of the two layers in the foregoing manner.

Figure 7B:
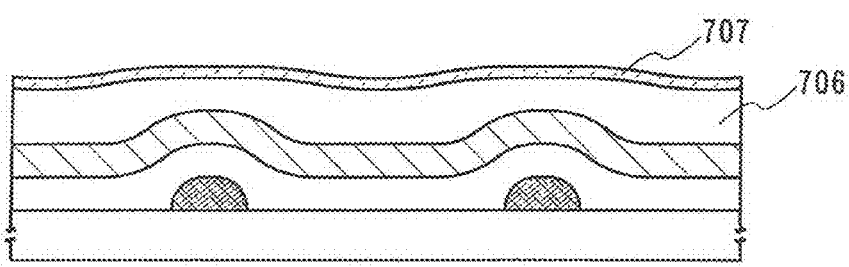

As shown in FIG. 7B, for example, an amorphous silicon film is formed over the second layer 705 of the gate insulating film by a CVD method as a first semiconductor film 706. The crystallinity of the first semiconductor film 706 is not limited to an amorphous state and may also be a microcrystalline state or a polycrystalline state. For example, a microcrystalline silicon film containing n-type impurities is formed over the first semiconductor film 706 as a second semiconductor film 707. Alternatively, the second semiconductor film 707 may also contain p-type impurities. In addition, the crystallinity of the second semiconductor film 707 is not limited to a microcrystalline state and may be any one of an amorphous state or a polycrystalline state.

Figure 7C:
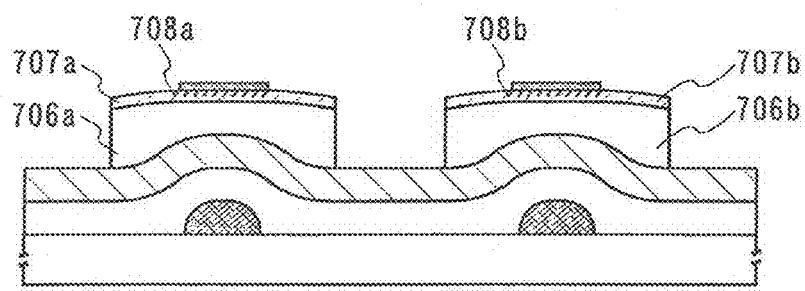

As shown in FIG. 7C, island-shape first semiconductor films 706a and 706b and island-shape second semiconductor films 707a and 707b is obtained by patterning the first semiconductor film 706 and the second semiconductor film 707. The first semiconductor film 706 and the second semiconductor film 707 can be patterned without a photomask by using a laser direct drawing apparatus.

Then, regions 708a and 708b in each surface of the island-shape second semiconductor films 707a and 707b are coated with an organic agent. The region 708a is a region at least overlapped with part of the gate electrode (wiring) 702, and the region 708b is a region at least overlapped with part of the gate electrode (wiring) 703. The organic agent to be coated to the regions 708a and 708b has to be a high boiling point agent that can improve the wettability of a fluid subsequently used to form source electrode and the drain electrode and that does not dry soon after the coating.

Figure 7D:
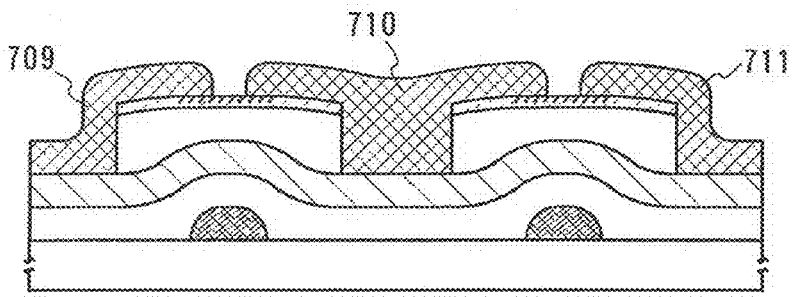

As shown in FIG. 7D, a source electrode and a drain electrode 709, 710, and 711 are formed by using an ink jetting technique. A fluid in which fine particles containing silver as the main component whose grain size is 1 nm or more and 100 nm or less are contained and the fine particles are dispersed in tetradecane can be used for the fluid to be discharged. The source electrode and the drain electrode 709, 710, and 711 are formed in the range of over the regions 708a and 708b to over the second layer 705 of the gate insulating film where the organic agent is not coated.

There is a curve (curved space) sandwiched between the source electrode and the drain electrode 709 and 710 over the gate electrode (wiring) 702. In addition, there is a curve (curved space) sandwiched between the source electrode and the drain electrode 710 and 711 over the gate electrode (wiring) 703. One of each ends of the source electrode and the drain electrode adjacent to each other by interposing the curved spaces therebetween is curved in a concave, and the other end is curved in a convex. Then, in order to follow the concave curve of the one end, the other end is curved in a convex.

Figure 7E:
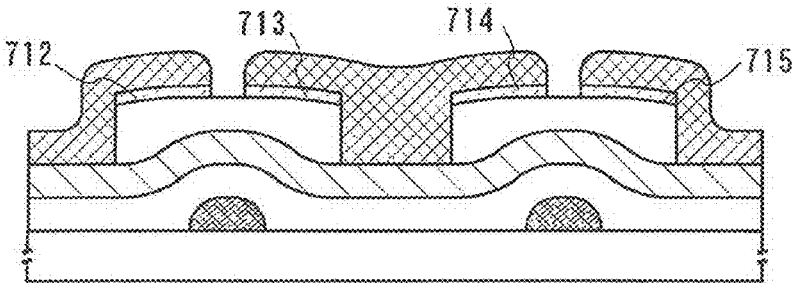

As shown in FIG. 7E, source/drain regions 712, 713, 714, and 715 are formed by etching the island-shape second semiconductor films 707a and 707b, using the source electrode and the drain electrode 709, 710, and 711 as masks. At the time of the etching, a dry etching method capable of anisotropic etching is used. The source/drain regions 712, 713, 714, and 715 that are formed have the same curved shapes as the source electrode and the drain electrode 709, 710, and 711.

The OFF-state current of a thin film transistor can be reduced much more than a single-gate structure shown in Embodiment Mode 2 by employing the double-gate structure shown in this embodiment mode.

In Embodiment Modes 1 to 4 explained in the foregoing manner, a bottom-gate thin film transistor is formed. However, the present invention disclosed in this specification is not limited to the bottom-gate thin film transistor and can also be applied to a so-called forward stagger thin film transistor in which a gate electrode is provided over a channel-forming region.

Embodiment 1

A thin film transistor, one of semiconductor elements, that is formed according to the present invention disclosed in this specification, is applied to various display devices. For example, a liquid crystal display device and an electroluminescence (EL) display device are given as an example of the display device to which the thin film transistor is applied; however, the display device is not limited thereto as long as the display device is a display device using the thin film transistor.

Figure 8A:
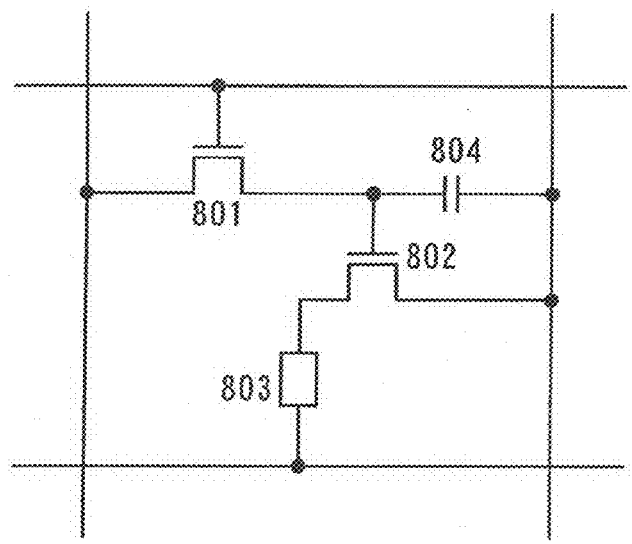
FIGS. 8A and 8B are circuit diagrams each showing the pixel portion of an EL display device shown in Embodiment 1.
Figure 8B:
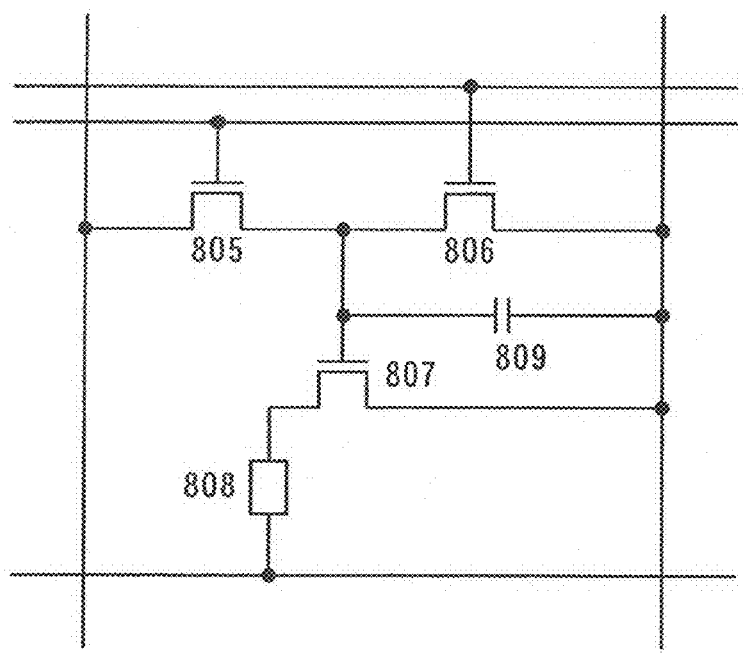

FIGS. 8A and 8B are circuit diagrams each showing an example of the pixel portion of an electroluminescence (EL) display device. Note that the pixel portion of the electroluminescence (EL) display device is not limited to these two examples.

FIG. 8A shows a type of a pixel portion having two thin film transistors in each pixel. Reference numerals 801 and 802 each denote a thin film transistor, and a light-emitting element 803 is connected to the source/drain electrode of the thin film transistor 802. Reference numeral 804 denotes a capacitor element. For example, the thin film transistor 801 is an n-channel type, and the thin film transistor 802 is a p-channel type. In the thin film transistor 801, the gate electrode is connected to a scanning line, and the source/drain electrode is connected to a signal line.

FIG. 8B shows a type of a pixel portion having three thin film transistors in each pixel. Reference numerals 805, 806, and 807 each denote a thin film transistor, and a light-emitting element 808 is connected to the source/drain electrode of the thin film transistor 807. Reference numeral 809 denotes a capacitor element. For example, the thin film transistor 805 is an n-channel type, the thin film transistor 806 is an n-channel type, and the thin film transistor 807 is a p-channel type. In the thin film transistor 805, the gate electrode is connected to a scanning line, and the source/drain electrode is connected to a signal line.

The invention disclosed in this specification can be applied to the thin film transistors of the pixel portions each shown in FIGS. 8A and 8B.

Figure 9A:
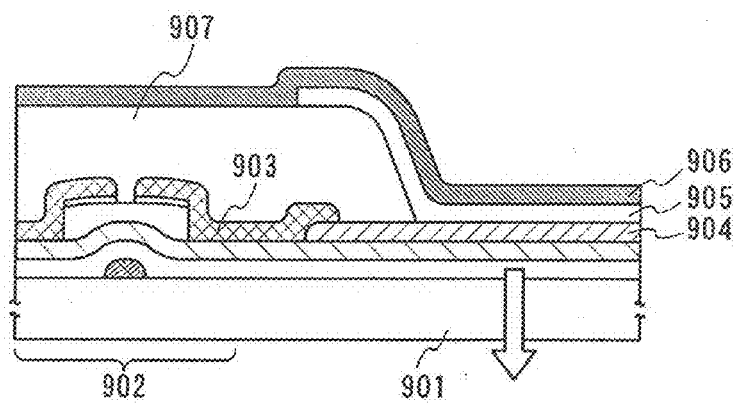
FIGS. 9A to 9C are cross-sectional views each showing the pixel portion of an EL display show in Embodiment 1.
Figure 9B:
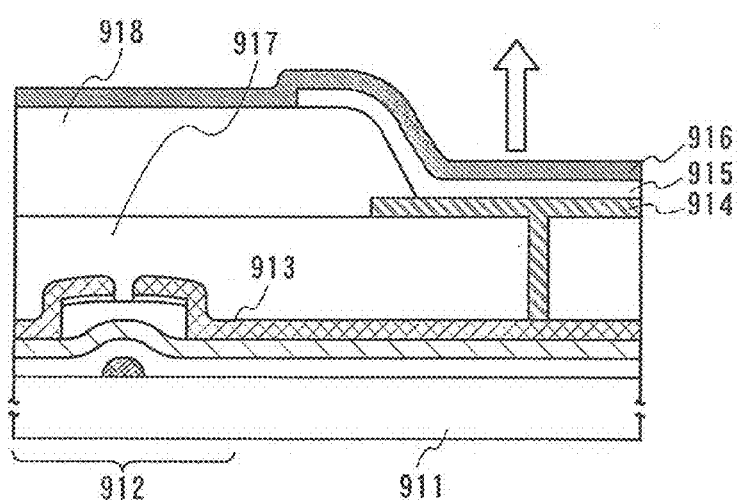
Figure 9C:
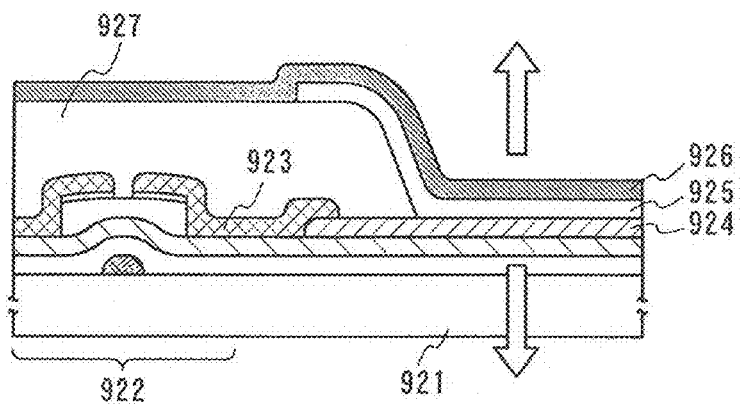

FIGS. 9A, 9B, and 9C each show an example of the pixel portion of an electroluminescence (EL) display device in a cross-sectional view. FIGS. 9A, 9B, and 9C each show a thin film transistor formed according to Embodiment Mode 2 and a light-emitting element electrically connected to the source/drain electrode of the thin film transistor over any one substrate of a glass substrate, a quartz substrate, or a plastic substrate.

In FIG. 9A, reference numeral 901 denotes a substrate; 902, a thin film transistor; 903, a source/drain electrode; 904, a light-transmitting first electrode; 905, an electroluminescent layer; 906, a second electrode; and 907, an insulating film. FIG. 9A shows a so-called bottom-emission type in which generated light is emitted to the substrate 901 side (bottom side).

In FIG. 9B, reference numeral 911 denotes a substrate; 912, a thin film transistor; 913, a source/drain electrode; 914, a first electrode; 915, an electroluminescent layer; 916, a light-transmitting second electrode; and 917 and 918, insulating films. FIG. 9B shows a so-called top-emission type in which generated light is emitted to an opposite side of the substrate 911 (top side).

In FIG. 9C, reference numeral 921 denotes a substrate; 922, a thin film transistor; 923, a source/drain electrode; 924, a light-transmitting first electrode; 925, an electroluminescent layer; 926, a light-transmitting second electrode; and 927, an insulating film. FIG. 9C shows a so-called dual emission type in which generated light is emitted both to an opposite side of the substrate 921 (top side) and to the substrate 921 side (bottom side).

Indium tin oxide (ITO), indium tin oxide containing silicon oxide, or indium zinc oxide (IZO) containing zinc oxide and indium oxide can be used as the light-transmitting first electrode or second electrode, which can be formed by a sputtering method or a droplet discharging method.

In the insulating films 907, 918, and 927 each shown in FIGS. 9A, 9B, and 9C, an opening that reaches the surface of the first electrode are each formed. It is preferable that the cross-section of each opening has a shape whose curvature radius continuously changes to be roundish in order to improve coverage of the electroluminescent layer and the second electrode. An inorganic insulating film such as silicon oxide or silicon nitride, an organic resin film such as polyimide, or the foregoing heat-resistant planarizing film that is obtained by coating and baking siloxane-based polymer can be used as the insulating films 907, 917, 918, and 927.

In each of FIGS. 9A, 9B, and 9C, one of the first electrode and the second electrode corresponds to an anode, and the other one to a cathode. When the first electrode is an anode and the second electrode is a cathode, a hole transporting layer, an organic emitting layer, and an electron transporting layer are sequentially stacked in the electroluminescent layers 905, 915, and 925. On the other hand, when the first electrode is a cathode and the second electrode is an anode, an electron transporting layer, an organic emitting layer, and a hole transporting layer are sequentially stacked in the electroluminescent layers 905, 915, and 925. A hole injecting layer may be provided between the anode and the hole transporting layer, and an electron injecting layer may be provided between the cathode and the electron transporting layer. The organic emitting layer can be formed by using any one of a droplet discharging method, a printing method, or a vacuum vapor-deposition method, and either a high molecular weight light-emitting material or a low molecular weight light-emitting material can also be used.

The invention disclosed in this specification can be applied to not only a thin film transistor used for the pixel portion of an electroluminescence (EL) display device but also when a scanning-line driver circuit and a signal-line driver circuit are each formed with a thin film transistor. High-speed operation is required for the thin film transistor used for these driver circuits. Therefore, since the thin film transistor having the long channel width W according to the invention disclosed in this specification has high ON-state current and high operation speed, the thin film transistor is suitable for the use of the drivers.

Figure 10A:
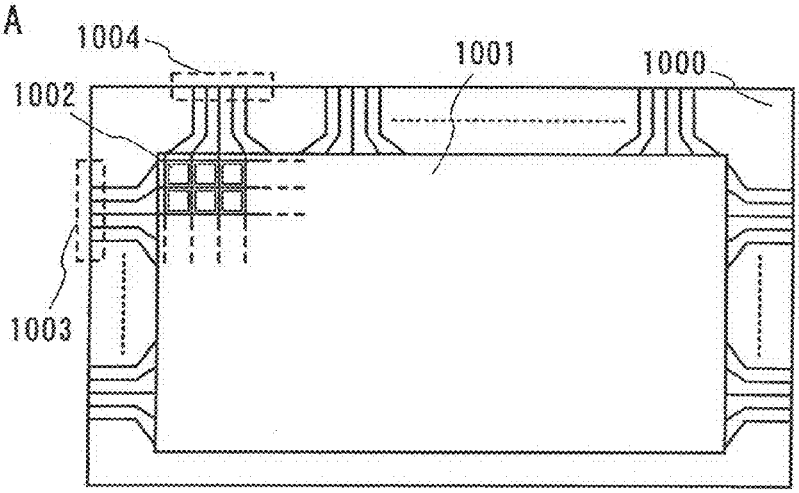
FIGS. 10A to 10C are top views each showing a configuration of a display device shown in Embodiment 1.
Figure 10B:
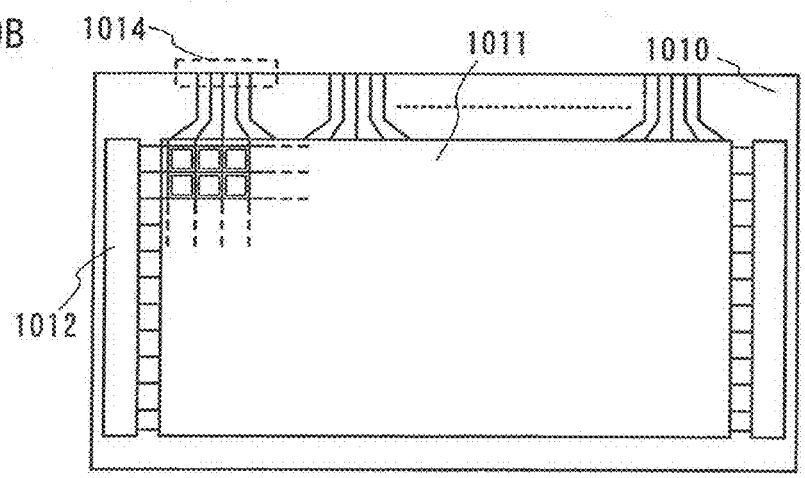
Figure 10C:
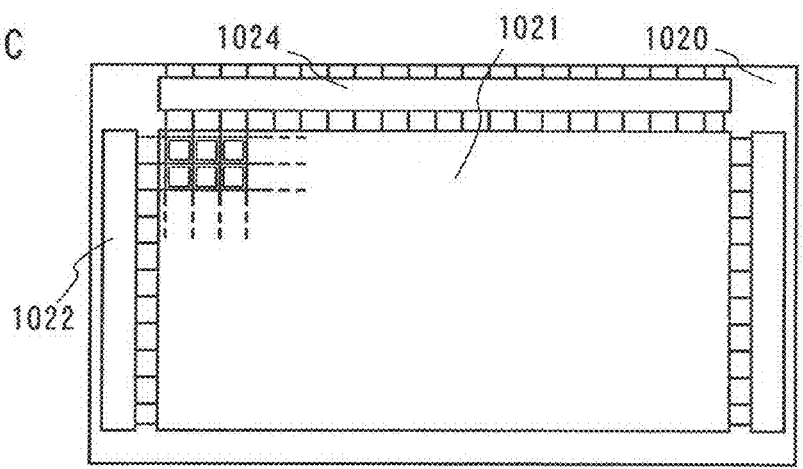

FIGS. 10A, 10B, and 10C are top views each showing a structure of a display device such as a liquid crystal display device or an electroluminescence (EL) display device to which the invention disclosed in this specification is applied.

In FIG. 10A, a pixel portion 1001 in which a plurality of pixels 1002 is arranged in matrix, a scanning-line input terminal 1003, and a signal-line input terminal 1004 are formed over a substrate 1000. A scanning line extending from the scanning-line input terminal 1003 and a signal line extending from the signal-line input terminal 1004 are intersected with each other; therefore, the pixels 1002 are arranged in matrix. Each pixel 1002 is provided with a switching element and a pixel electrode. A typical example of the switching element is a thin film transistor. FIG. 10A exemplifies a display device in which signals inputted into the scanning line and the signal line are controlled by a driver circuit connected to exterior of the substrate via the scanning-line input terminal 1003 and the signal-line input terminal 1004. However, a COG method for forming a driver circuit over a substrate may also be used.

FIG. 10B is an example in which a pixel portion 1011 and a scanning-line driver circuit 1012 are formed over a substrate 1010. Reference numeral 1014 denotes a signal-line input terminal which is the same as that in FIG. 10A. In addition, FIG. 10C is an example in which a pixel portion 1021, a scanning-line driver circuit 1022, and a signal-line driver circuit 1024 are formed over a substrate 1020.

The scanning-line driver circuit 1012 shown in FIG. 10B and the scanning-line driver circuit 1022 and the signal-line driver circuit 1024 each shown in FIG. 10C are each formed with a thin film transistor, which can be formed simultaneously with the thin film transistors provided in the pixel portions. However, high-speed operation is required for the scanning-line driver circuit and the signal-line driver circuit. Therefore, a thin film transistor using a microcrystalline semiconductor film or a polycrystalline semiconductor film which has higher mobility than an amorphous semiconductor film for the channel-forming region has to be selected as a thin film transistor used for these circuits.

A thin film transistor manufactured according to the invention disclosed in this specification can be applied at least to the pixel portions shown in FIGS. 10A, 10B, and 10C, and can also be applied to the scanning-line driver circuit 1012 shown in FIG. 10B and to the scanning-line driver circuit 1022 and the signal-line driver circuit 1024 shown in FIG. 10C.

A thin film transistor manufactured according to the invention disclosed in this specification can be applied not only to an electroluminescence (EL) display device but also at least to the pixel portion and further to the driver circuit of a liquid crystal display device.

Figure 11:
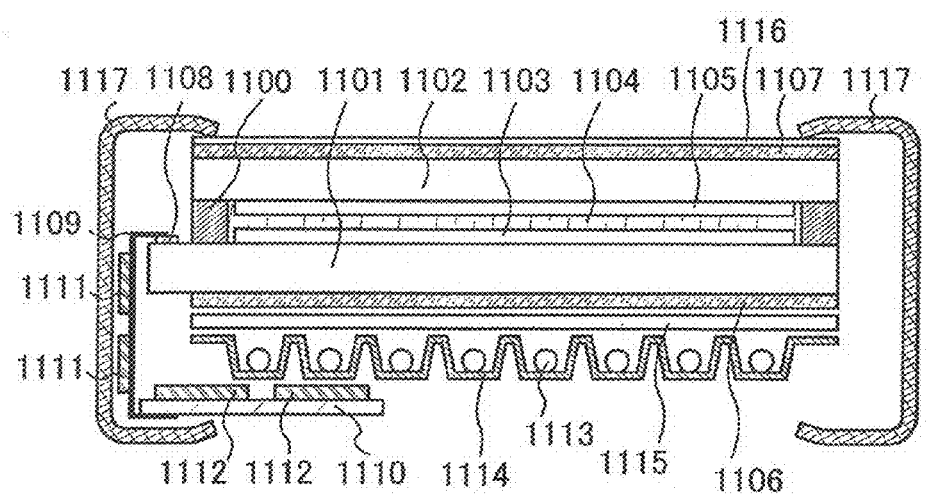
FIG. 11 is a view showing a liquid crystal display device shown in Embodiment 1.

In this embodiment, FIG. 11 shows one example of a liquid crystal display device to which the invention disclosed in this specification is applied. The liquid crystal display device is not limited to the example shown in FIG. 11.

A liquid crystal layer 1104 is provided between a first substrate 1101 and a second substrate 1102, and the substrates adhere to each other with a sealant 1100. A pixel portion 1103 is formed in the first substrate 1101, and a colored layer 1105 is formed in the second substrate 1102. The colored layer 1105, which is necessary in performing color display, is provided with colored layers corresponding to each color of red, green, and blue corresponded to each pixel in the case of a RGB method. Polarizing plates 1106 and 1107 are each provided on the outer sides of the first substrate 1101 and the second substrate 1102. In addition, a protective film 1116 is formed on the surface of the polarizing plate 1107 to relieve impact from the exterior.

A thin film transistor is formed in the pixel portion 1103, and the thin film transistor according to the invention disclosed in this specification can be applied.

A wiring board 1110 is connected to a connected terminal 1108 provided for the first substrate 1101 via an FPC 1109. The FPC 1109 or a connection wiring is provided with driver circuits 1111 (an IC chip or the like), and the wiring board 1110 is provided with an external circuit 1112 such as a control circuit or a power supply circuit.

A cold cathode tube 1113, a reflection plate 1114, and an optical film 1115 are each a backlight unit, which serve as a light source. The first substrate 1101, the second substrate 1102, the light source, the wiring board 1110, and the FPC 1109 are held and protected by a bezel 1117.

Embodiment 2

This embodiment will show an electronic device on which a display device described in Embodiment 1 is mounted. The following can be given as an example of the electronic devices on which the display device is mounted: a television apparatus, a camera such as a digital camera, a personal computer, a cellular phone device, and the like. However, the display device to which the present invention disclosed in this specification is applied is not limited to the case where the display device is mounted on these electronic devices.

Figure 12:
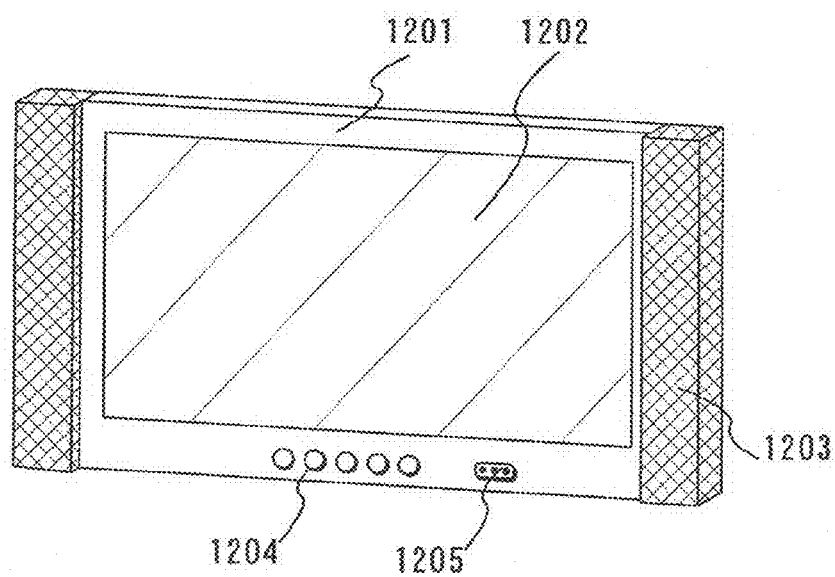
FIG. 12 is a view showing an electronic device shown in Embodiment 2.

FIG. 12 shows one example of the television apparatus. Reference numeral 1201 denotes a casing; 1202, a display portion; 1203, a speaker; 1204, an operation portion; and 1205, a video input terminal. The display device to which the invention disclosed in this specification is applied is used for the display portion 1202.

Figure 13A:
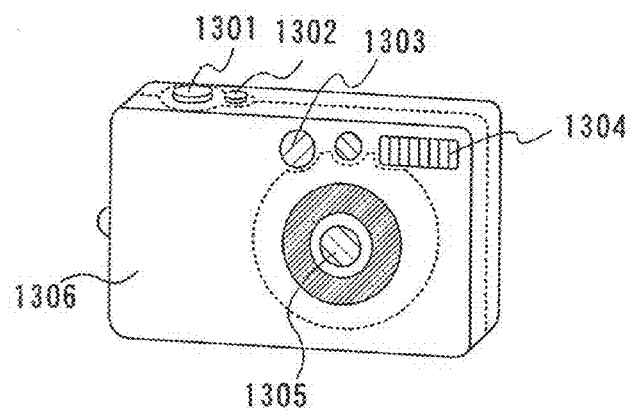
FIGS. 13A and 13B are views each showing an electronic device shown in Embodiment 2.
Figure 13B:
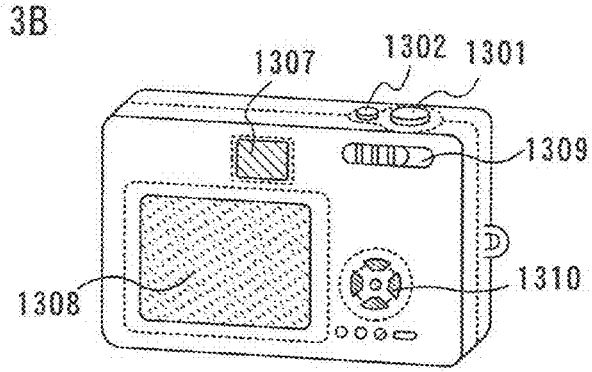

FIGS. 13A and 13B show one example of the digital camera. FIG. 13A is a view showing the digital camera from a front face, and reference numeral 1301 denotes a release button; 1302, a main switch; 1303, a viewfinder window; 1304, a stroboscope; 1305, a lens; and 1306, a casing. FIG. 13B is a view showing the digital camera from back face, and reference numeral 1307 denotes a viewfinder eyepiece; 1308, a monitor; and 1309 and 1310, operation buttons. The display device to which the invention disclosed in this specification is applied is used for the monitor 1308.

The invention disclosed in this specification can be applied not only to the television apparatus and the digital camera but also to an electronic device having a display portion and a monitor.

The present application is based on Japanese Patent Application serial No. 2004-241119 filed on Aug. 20, 2004 in Japanese Patent Office, the entire contents of which are hereby incorporated by reference.

What is claimed is:

1. A method for manufacturing a display device comprising the steps of:
    forming a gate electrode over a substrate;
    forming an insulating film over the gate electrode;
    coating a region of the insulating film surface at least overlapped with part of the gate electrode with an organic agent;
    discharging a fluid in which conductive fine particles whose grain size is 1 nm or more and 100 nm or less are dispersed in an organic solvent by a droplet discharging method in a region where the organic agent is coated and left and a region of the insulating film where the organic agent is not coated;
    baking and hardening the fluid to form a source electrode and a drain electrode; and
    forming a semiconductor film to be in contact with the source electrode, the drain electrode and the insulating film in a curve sandwiched between the source and drain electrodes,
    wherein the organic agent is coated to improve wettability of the fluid in the insulating film surface than in the region where the organic agent is not coated.

2. A method for manufacturing a display device comprising the steps of:
    forming a gate electrode over a substrate;
    forming an insulating film to cover the gate electrode;
    forming a first semiconductor film over the insulating film;

forming a second semiconductor film containing an impurity element over the first semiconductor film;

patterning the first semiconductor film and the second semiconductor film each to be an island-shape;

coating a region of the island-shape semiconductor film surface at least overlapped with part of the gate electrode with an organic agent;

discharging a fluid in which conductive fine particles whose grain size is 1 nm or more and 100 nm or less are dispersed in an organic solvent by a droplet discharging method in a region where the organic agent is coated and left and a region where the organic agent is not coated;

baking and hardening the fluid to form a source electrode and a drain electrode; and forming a source region and a drain region by dry etching the second semiconductor film with the use of the source electrode and the drain electrode as masks, wherein the organic agent is coated to improve wettability of the fluid in the second semiconductor film surface than in the region where the organic agent is not coated.

3. The method for manufacturing a display device according to claim 1, wherein the semiconductor film is formed by using an organic semiconductor.

4. The method for manufacturing a display device according to claim 2, wherein the insulating film is formed of a first layer and a second layer formed over the first layer which is formed from different material from that of the first layer.

5. The method for manufacturing a display device according to claim 2, wherein the impurity element is a p-type impurity element.

6. The method for manufacturing a display device according to claim 2, wherein the impurity element is an n-type impurity element.

7. The method for manufacturing a display device according to claim 1, wherein one of each ends of the source and drain electrodes adjacent to each other by interposing the curve therebetween is formed by being curved in a concave, and the other end is formed by being curved in a convex.

8. The method for manufacturing a display device according to claim 2, wherein a curve sandwiched between the source and drain electrodes and between the source and drain regions is formed according to said forming the source electrode and the drain electrode and said forming the source region and the drain region, wherein one of side edges of the source electrode and the drain electrode which is opposed to each other with the curve interposed therebetween is formed by being curved in a concave, and the other end is formed by being curved in a convex, wherein a side edge of the source region which is opposed to a side edge of the drain region has the same shape as the side edge of the source electrode, and wherein the side edge of the drain region has the same shape as the side edge of the drain electrode.

9. The method for manufacturing a display device according to claim 1, wherein the curve is a curved space.

10. The method for manufacturing a display device according to claim 8, wherein the curve is a curved space.

11. A method for manufacturing a display device comprising the steps of:

forming a wiring over a substrate;

forming an insulating film over the wiring;

coating a part of the insulating film with an organic agent wherein the part of the insulating film is overlapped with the wiring;

forming a first film by discharging a fluid to the insulating film such that a part of the first film is overlapped with the part of the insulating film;

forming a second film by discharging a fluid to the insulating film such that a part of the second film is overlapped with the part of the insulating film; and forming a third film over the first film and the second film wherein the third film is in contact with the part of the insulating film.

12. A method according to claim 11, wherein the first film is a conductive film.

13. The method according to claim 11, wherein the second film is a conductive film.

14. The method according to claim 11, wherein the third film is a semiconductor film.

15. A method for manufacturing a display device comprising the steps of:

forming a gate electrode over a substrate;

forming an insulating film over the gate electrode;

coating a part of the insulating film with an organic agent wherein the part of the insulating film is overlapped with the gate electrode;

forming a first film by discharging a fluid to the insulating film such that a part of the first film is overlapped with the part of the insulating film;

forming a second film by discharging a fluid to the insulating film such that a part of the second film is overlapped with the part of the insulating film; and forming a third film over the first film and the second film wherein the third film is in contact with the part of the insulating film.

16. The method according to claim 15, wherein the first film is a conductive film.

17. The method according to claim 15, wherein the second film is a conductive film.

18. The method according to claim 15, wherein the third film is a semiconductor film.

* * * * *